United States Patent [19]

Hayek et al.

[11] Patent Number: 5,978,952
[45] Date of Patent: Nov. 2, 1999

[54] TIME-DISTRIBUTED ECC SCRUBBING TO CORRECT MEMORY ERRORS

[75] Inventors: George R. Hayek, Cameron; Radhakrishnan Venkataraman; Jasmin Ajanovic, both of Folsom, all of Calif.

[73] Assignee: Intel Corporation, Santa Clara, Calif.

[21] Appl. No.: 08/777,252

[22] Filed: Dec. 31, 1996

[51] Int. Cl.[6] .................... G11C 11/403; G11C 29/00; G06F 11/00
[52] U.S. Cl. ............................... 714/764; 714/773
[58] Field of Search ................. 371/40.2, 40.18; 395/182.04; 714/764, 773

[56] References Cited

U.S. PATENT DOCUMENTS

| | | | |
|---|---|---|---|
| 4,535,455 | 8/1985 | Peterson | 395/184.02 |
| 5,263,032 | 11/1993 | Porter et al. | 371/40.2 |
| 5,367,689 | 11/1994 | Mayer et al. | 395/733 |
| 5,490,155 | 2/1996 | Abdoo et al. | 371/40.11 |
| 5,717,903 | 2/1998 | Bonola | 395/500 |

OTHER PUBLICATIONS

Slater, M., "Microprocessor–Based Design", Mayfield Pub. Co., 1987, p. 239, Dec. 1987.
van de Goor, A., "Computer Architecture and Design", Addison–Wesley Pub. Co., 1989, pp. 255–263, Dec. 1989.

*Primary Examiner*—Stephen M. Baker
*Attorney, Agent, or Firm*—Blakely, Sokoloff, Taylor & Zafman

[57] ABSTRACT

Error correction circuitry attempts to detect and correct on the fly erroneous words within random access memory (RAM) within a computer system. RAM errors are scrubbed or corrected back in the memory without delaying the memory access cycle. Rather, the address of the section or row of RAM that contains the correctable error is latched for later used by an interrupt-driven firmware memory-error scrub routine. This routine reads and rewrites each word within the indicated memory section—the erroneous word is read, corrected on-the-fly as it is read, and then rewritten back into memory correctly. If the size of the memory section exceeds a predetermined threshold, then the process of reading and re-writing that section is divided into smaller sub-processes that are distributed in time using a delayed interrupt mechanism. Duration of each memory scrubbing subprocess is kept short enough that the response time of the computer system is not impaired with the housekeeping task of scrubbing RAM memory errors. System management interrupts and firmware may be used to implement the memory-error scrub routine, which makes it independent of and transparent to the various operating systems that may be run on the computer system.

12 Claims, 6 Drawing Sheets

| DATA BITS | | | | | | | | CHECK BITS | SYNDROME BIT |
|---|---|---|---|---|---|---|---|---|---|
| 7 | 15 | 23 | 31 | 39 | 47 | 55 | 63 | 01234567 | |
| 10001000 | 10001000 | 10001000 | 01000001 | 11000000 | 00001111 | 00001111 | 11111000 | 11001001 | s0 |
| 01000100 | 01000100 | 01000100 | 01000011 | 01000000 | 11110000 | 11110000 | 11111001 | 10001100 | s1 |
| 00100010 | 00100010 | 00100010 | 01100010 | 01001111 | 00000000 | 11111111 | 00001100 | 11001000 | s2 |
| 00010001 | 00010001 | 00010001 | 11000011 | 01101111 | 11111111 | 00000000 | 00001000 | 01001000 | s3 |
| 00000000 | 11110000 | 11111111 | 10001100 | 10011000 | 10001000 | 10001000 | 10000100 | 00011100 | s4 |
| 00001111 | 00001111 | 00001111 | 10011000 | 10011000 | 01000100 | 01000100 | 01000100 | 00110100 | s5 |
| 11110000 | 00001111 | 11110000 | 11001100 | 10000010 | 00100010 | 00100010 | 00100110 | 00100100 | s6 |
| 11111111 | 11110000 | 00000000 | 10000100 | 10000001 | 00010001 | 00010001 | 00011100 | 00110110 | s7 |

FIG. 6

TIME-DISTRIBUTED ECC SCRUBBING TO CORRECT MEMORY ERRORS

FIELD OF THE INVENTION

The present invention relates to error correction within digital computer systems. In particular, it relates to scrubbing, or correcting, errors in memory in a time-distributed manner.

BACKGROUND OF THE INVENTION

When data is read back from a memory in which it has been stored, it occasionally happens that an error occurs, i.e. that the data read back is not identical to the data previously stored.

A number of error correcting codes (ECC) are known in the prior art that are capable of not only detecting but also correcting errors. Typically, these codes can detect a broader range of errors than they can correct. For example, a DED-SEC code is capable of detecting any double errors that occur within the data field the code covers (i.e. errors in which two bits within the field are erroneous) and of correcting any single errors (i.e. only one wrong bit).

As applied to main memory or Random Access Memory (RAM) within a computer system, it may be desirable to consider each 64-bit double word as its own data field, i.e., to store along with it its own ECC or redundancy check information. As the computer system reads words from memory, this ECC information would be checked so that errors in the word could be detected and hopefully corrected.

If the ECC hardware detects a correctable error, then it is desirable to correct the word being read on-the-fly so as to provide the processor or I/O controller that is reading main memory with a corrected word. This is a performance critical task because accessing main memory is one of the most performance-critical aspects of computer system design. Any improvement or degradation in the latency between an access request and the delivery of the data requested often has a substantial effect on overall system performance.

It is further desirable to correct the word in main memory because errors accumulate over time. If subsequent errors occur within the same word, then they may convert a correctable error into an un-correctable error. The process of correcting the data stored in memory is called scrubbing the memory. Compared with the on-the-fly correction described above, the process of correcting the data stored in main memory is more time consuming and more costly in terms of requiring additional hardware and/or software to implement it.

In one approach to scrubbing memory, it is desired to not impose any of the error correction task on software. In this case, it would be desirable to include in the memory controller a state machine that temporarily suspends the normal operation of the memory and writes the corrected word back to the erroneous memory location. Disadvantages of this approach include both the complexity of the hardware that would be required to do the write back and the performance penalty because the memory would not be accessible for other purposes until the correct and re-write process is completed.

In another approach to scrubbing memory, it is desired to keep hardware costs and complexity at a minimum and impose most of the error correction task on software. Such an approach would find it desirable to generate an interrupt to activate software or firmware, executing on the processor, to correct the erroneous memory location. Unfortunately, in some systems the limited number of interrupt request signals or vectors that are available are already utilized. Also, a different version of the correction routine may be required for each different operating system that will be run on the computer system.

SUMMARY OF THE INVENTION

A computer system includes a processor and a memory with error correction capabilities. The memory is partitioned into sections.

When a controller for the memory determines that a memory word contains a correctable error, it indicates to the processor, via an interrupt, the section of memory to which the erroneous word belongs. In response, the processor reads and rewrites each word within that section of the memory. The interrupt mechanism used is distinct from that used for input/output interrupts.

In some embodiments, the memory controller generates the error correction check bits when data is written to the memory. In some embodiments, the memory controller corrects the memory data as it is read from the memory into the processor. In some embodiments, the address space, processor state and register set used by the processor for the reading and re-writing process is distinct from that used during normal processor operation and distinct from that used for input/output interrupts.

BRIEF DESCRIPTION OF THE DRAWINGS

The present invention is illustrated in the following drawings, in which known circuits are shown in block-diagram form for clarity. These drawings are for explanation and for aiding the reader's understanding. The present invention should not be taken as being limited to the preferred embodiments and design alternatives illustrated.

FIG. 6 shows the error correction matrix used in one embodiment of the present invention. This matrix determines both how the error check bits are generated from the data bits and how a single erroneous bit can be identified from the syndrome bits.

DETAILED DESCRIPTION OF THE INVENTION

Architecture

Disclosed herein are various alternative embodiments and design alternatives of the present invention which, however, should not be taken as being limited to the embodiments and alternatives described. One skilled in the art will recognize alternative embodiments and various changes in form and detail that may be employed while practicing the present invention without departing from its principles, spirit or scope.

Figure 1:
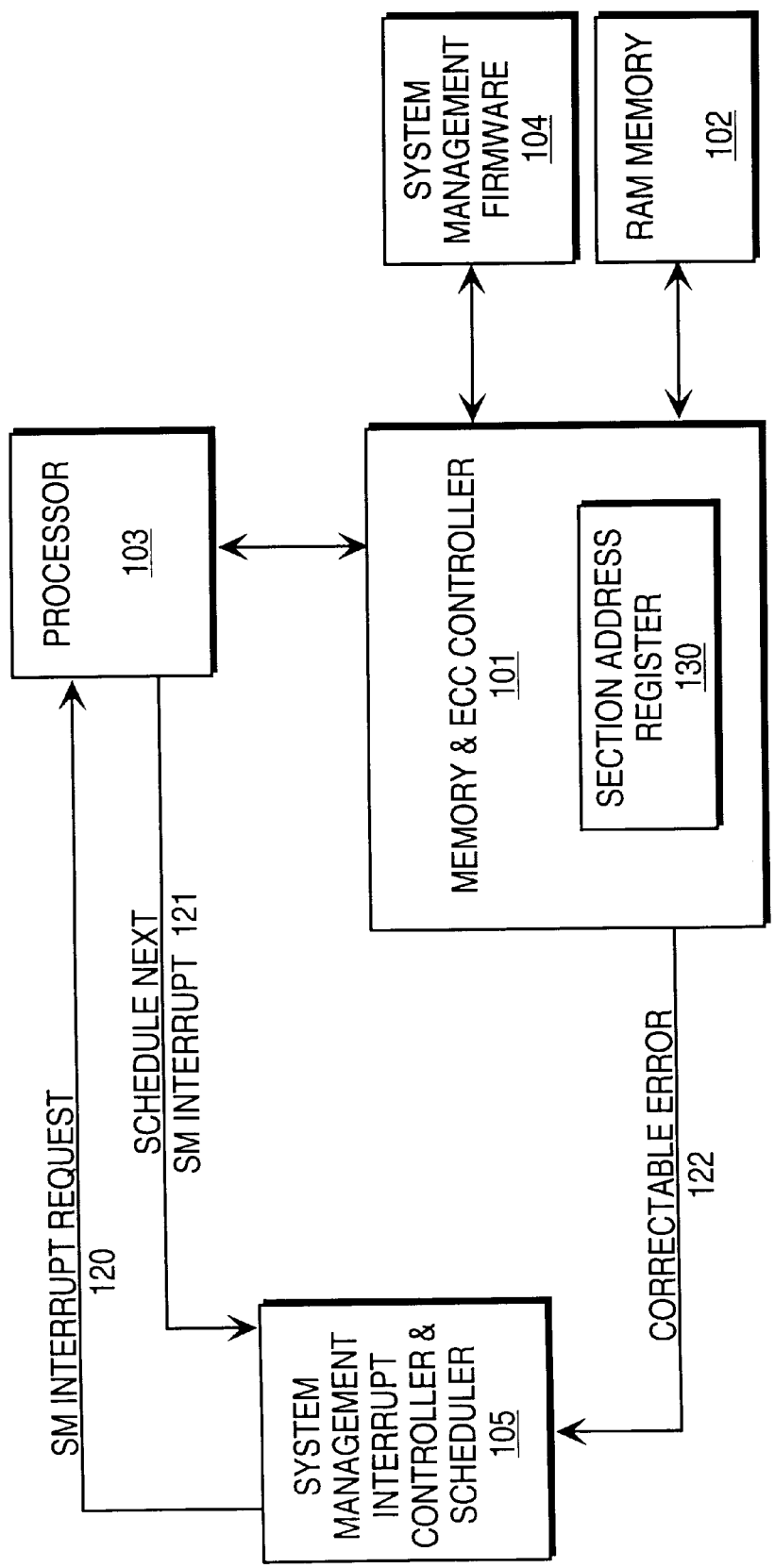
FIG. 1 shows the components of the error correcting scrubber of the present invention and their interconnections

The present invention is a method and apparatus for correcting erroneous words within a computer system memory. FIG. 1 is a system architecture diagram of the memory and processor portion of a computer system that uses a RAM scrubber according to one embodiment of the present invention.

As words are read from memory, ECC circuitry attempts to detect and, if possible, proceeds to correct errors on the fly, i.e. before they are provided to the requester.

If a correctable error occurs, the ECC circuitry performs the correction and provides the corrected data word to the requester. In one embodiment, a one-cycle delay in memory access latency accommodates the error correction process.

The ECC circuitry scrubs, or corrects, the errors in RAM without delaying the memory access cycle to do so. The corrected word is not immediately rewritten into RAM. Rather, an indication of the section of RAM in which the error occurred is latched for later use by a firmware memory scrubbing routine.

In one embodiment, the ECC circuitry does not require that the full word address of the erroneous word be latched. Rather, in order to reduce hardware cost and complexity, substantially fewer bits than a full word address are stored—the stored bits indicating only which section of memory contains the erroneous word. In one embodiment, each section corresponds to a memory row and the row address is latched to indicate the section to be scrubbed.

The section address is provided to an interrupt-driven firmware routine that scrubs that section, i.e. that reads and rewrites each memory word within that section. This ensures that the erroneous word is read, corrected on-the-fly as it is read, and then rewritten. When the word is rewritten back into memory, it is stored correctly. This is desirable because errors accumulate over time and a second error within the same memory word is likely to make that word uncorrectable.

If the size of a memory section exceeds a predetermined threshold, then the process of scrubbing that section is divided into smaller sub-processes. These sub-processes are distributed in time using delayed interrupts. By keeping the duration of each subprocess below a threshold, the ECC circuitry ensures that the response time of the computer system is not significantly impaired by the housekeeping task of scrubbing memory errors.

If an un-correctable error occurs, the ECC circuitry generates a software interrupt. Often, such an error is not recoverable and the process executing must be aborted or the system must be re-booted.

In one embodiment, system management interrupts and firmware provide this memory error scrubbing in a manner that is independent of and transparent to the operating system running on the computer system. System management interrupts (SMIs) occupy an interrupt vector space that is independent of that of regular interrupts, such as input/output interrupts. System management interrupt service routines execute in a program address space that is independent of that of regular program execution and of that of regular interrupts. System management interrupt service routines make use of processor state information that is independent of that used for regular program execution and of that used for regular interrupts.

In this embodiment, there are no conflicts or contention for interrupt vectors or program address space between the memory scrubbing routine and any normal program or interrupt activities. Further, there are no operating-system specific drivers required to support memory scrubbing. The advantages of this embodiment include enhancing the reliability and and the platform or system independence of the ECC scrub operation.

Each word in RAM memory 102 as shown in FIG. 1 comprises both data bits and error correction code (ECC) or error check bits. In one embodiment, each word comprises 64 data bits and 8 check bits. Typically, the memory being checked for errors is a random access memory (RAM), such as the computer system main memory, or input/output buffer memory. Nevertheless, the ECC circuitry and methods described herein is adaptable to any digital memory that can be written on a word-by-word basis.

All read from and writes to memory 102 pass through memory and ECC controller 101. Whenever a word is written to RAM memory 102, memory and ECC controller 101 generates error check bits from the data bits provided by the device requesting the write, such as processor 103. In one embodiment, partial word writes are supported by means of a read modify write cycle, as is known in the prior art.

Typically memory and ECC controller 101 also provides read and write access to RAM memory 102 to other devices (not shown), such as peripheral device controllers. Typically this is done via a system bus (not shown).

When a word within RAM memory 102 is read, memory and ECC controller 101 computes a syndrome based on the values of the data and check bits read. If the syndrome is 0, no error occurred. This is the most prevalent situation. Occasionally, an error occurs and the word from RAM memory 102 has one or more bits reversed. In the case of a correctable error, memory and ECC controller 101 corrects the erroneous word on the fly, that is it provides to the requester a corrected version of the word requested.

The present invention makes no attempt to correct the contents of RAM memory 102 as it is being read. Rather, when memory and ECC controller 101 detects a correctable error, it activates correctable error signal 122, which signals system management interrupt controller and scheduler 105 to initiate a memory scrub operation. This signaling may be done via a system bus, to which both memory and ECC controller and system management interrupt controller and scheduler 105 are coupled.

At the appropriate time (there may be higher priority interrupts pending), interrupt controller and scheduler 105 generates a system management interrupt by activating system management interrupt request signal 120. Other embodiments of the invention could use the computer system's non-maskable interrupt mechanism or its regular interrupt mechanism.

In response, though not necessarily immediately, processor 103 acknowledges the system management interrupt (SMI) request and transfers control to a memory scrubbing interrupt service routine that is resident in system management memory 104. System management memory 104 is typically a non-volatile memory, such as a programmable read only memory (PROM) or flash memory. This memory may also contain the computer system's basic input output system (BIOS).

The memory scrubbing routine reads the contents of section address register 130, which is part of memory and ECC controller 101. Section address register 130 indicates which section of memory needs to be scrubbed. It may or may not complete the scrubbing operation at one time. If it does not, it activates schedule system management interrupt signal 121. This causes interrupt controller and scheduler 105 to schedules another system management interrupt after a programmable delay.

In one embodiment, memory and ECC controller 101 is implemented in a first integrated circuit that also couples processor 101 and RAM memory 102 to a high-speed system bus (not shown) that complies with the well known peripheral component interconnect (PCI) specification. In this embodiment, system management interrupt controller and scheduler 105 is implemented in a second integrated circuit that also couples this PCI bus with a industry standard architecture (ISA) bus. In this embodiment, schedule system management interrupt signal 121 is implemented by writing specified values to specified control registers within the second integrated circuit.

Operation

Figure 2:
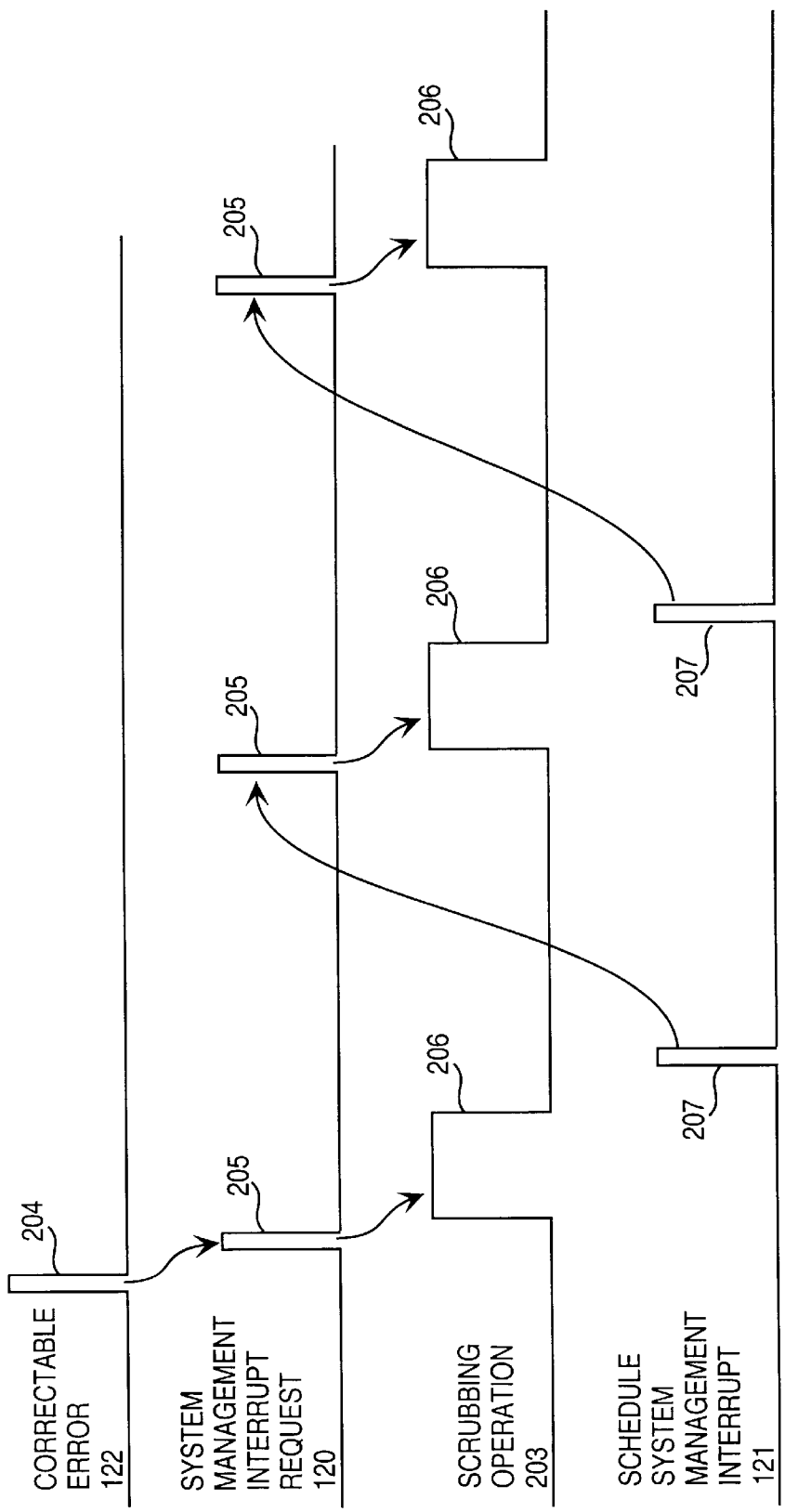
FIG. 2 shows the time sequence of the scrubbing operation of the present invention and its associated control signals.

FIG. 2 is an example timing diagram showing how scrubbing operation 203 is distributed in time. Scrubbing operation 203 is active during each of time periods 206, which are separated by substantial time intervals. Each time period 206 is initiated by a corresponding activation 205 of system management interrupt request signal 120. In the particular example sequence shown in FIG. 2, as single activation of correctable error 122 (i.e., a single occurrence of a correctable memory error) results in three activations 205 of system management request signal.

The first activation 205 is generated by system management interrupt controller and scheduler 105 in response to activation 204 of correctable error signal 122. Correctable error signal 122 is generated by memory and ECC controller 101.

Each subsequent activation 205 is generated by system management interrupt controller and scheduler 105, in response to but after a programmable delay from each activation 207 of schedule system management interrupt signal 121. Schedule system management interrupt signal 121 is generated by processor 103 acting under control of system management firmware 104.

When system management firmware 104 completes scrubbing the section of memory that contains the correctable error, it does not schedule another system management interrupt. Scrubbing operation 203 is not active again until memory and ECC controller 101 detects another correctable error and activates correctable error signal 122.

Figure 3:
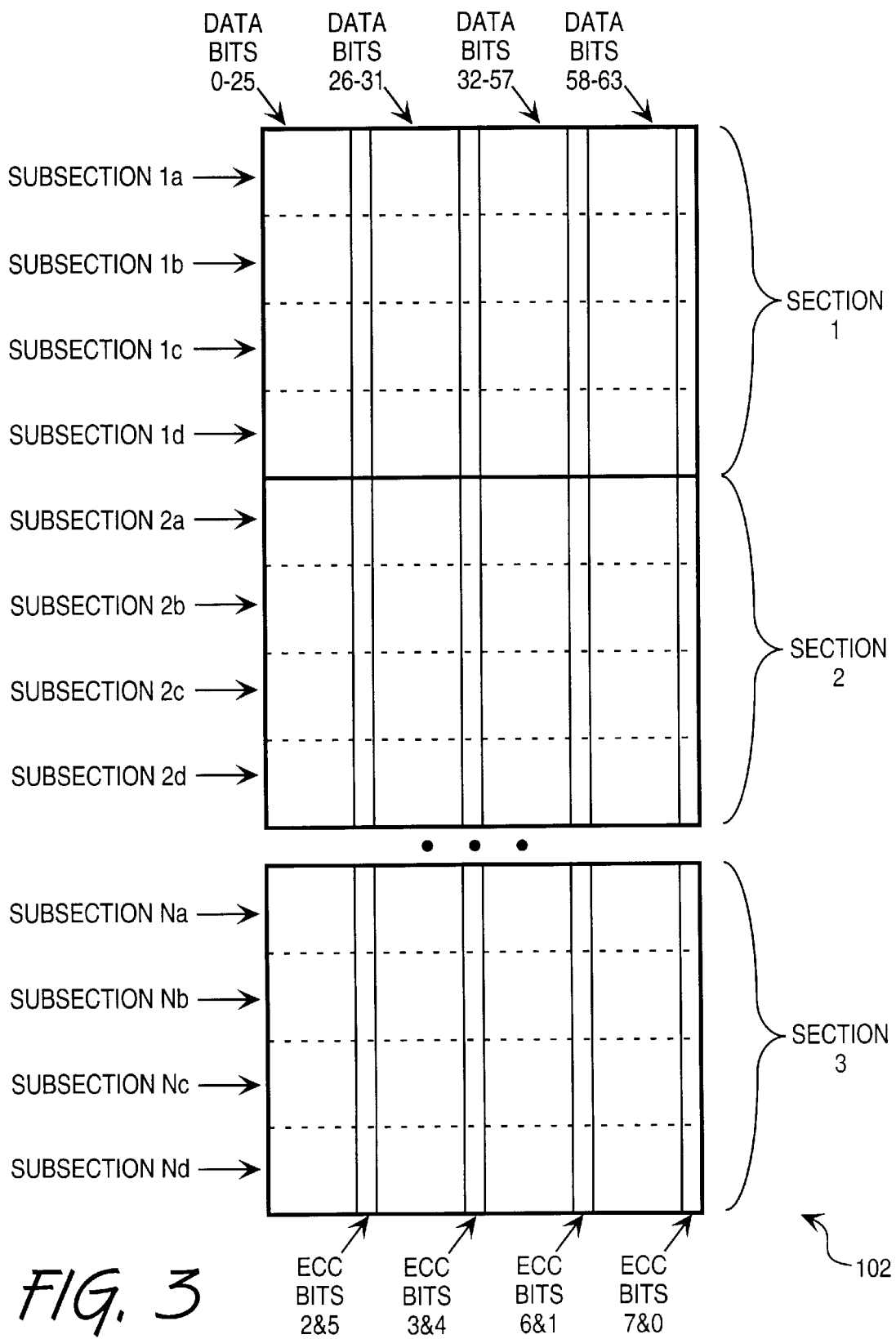
FIG. 3 shows how one embodiment interleaves check bits and data bits within a memory word and how it divides RAM into N sections of four subsections each.

FIG. 3 is a memory map showing the layout of RAM memory 102 according to one embodiment. In this embodiment, RAM memory 102 is divided into N sections, numbered 1 to N. To shorten the duration of each of time periods 206, each section of RAM memory 102 is divided into four subsections, denoted "a" through "d".

For example, if a correctable error occurs within Section 2, then subsection 2a is scrubbed during one time period 206 and another system management interrupt is scheduled, then subsection 2b is scrubbed during another time period 206 and another system management interrupt is scheduled, then subsection 2c is scrubbed during another time period 206 and another system management interrupt is scheduled, then subsection 2d is scrubbed during a final time period 206.

The memory map of FIG. 3 also shows, according to one embodiment of the invention, how the ECC or check bits are interleaved among the data bits. Using this particular interleaving and the particular ECC code shown in FIG. 6, the present invention detects any error that is confined within a single 4-bit nibble (i.e., bits 0 to 3, 4 to 7, etc.).

RAM memory 102 may be implemented using a series of integrated circuits (ICs) each of which holds one nibble's worth of data for a number of words. If one such IC, which may be a single in-lime memory module (SIMM), is missing or defective, then all of bits of that nibble can be erroneous. Because this is a common failure mode, it is desirable to be able to detect that.

The bit order within the code word according to this embodiment is as follows:

1. Data bits 0 to 25
2. Check bit 2
3. Check bit 5
4. Data bits 26 to 31
5. Check bit 3
6. Check bit 4
7. Data bits 32 to 57
8. Check bit 6
9. Check bit 1
10. Data bits 58 to 63
11. Check bit 7
12. Check bit 0

In another embodiment, the error code of FIG. 6 is used, but the check bits, if used, are stored in bits 64 to 71 of the memory word. When the computer system is initially booted at power on self test (POST) time, then the system BIOS can determine or look up whether or not the system is ECC capable, i.e. whether bits 64 to 71 are actually present in RAM memory 102. The BIOS enables or disables memory ECC checking accordingly. This embodiment allows the same system design and components to be used both for a lower-cost computer system that does not have memory error detection and correction capabilities and a higher-reliability computer system that does.

Figure 4:
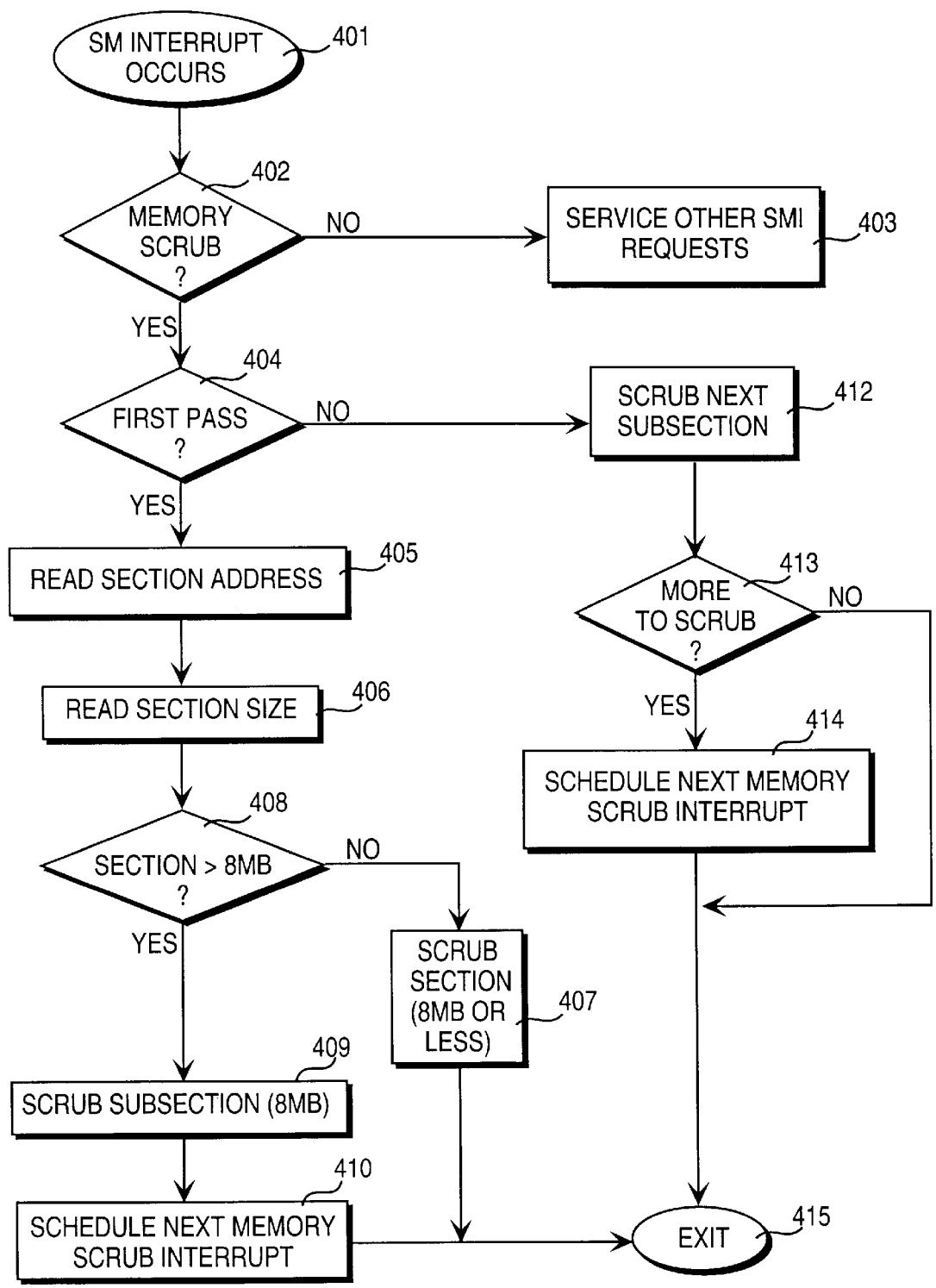
FIG. 4 shows the sequence of steps that the system management firmware goes through to scrub memory errors.

FIG. 4 is a flow chart showing the steps within the memory scrub interrupt service routine. This interrupt handler starts 401 when processor 103 acknowledges an occurrence of a system management interrupt. Next, processor 103 in step 402 determines whether the active interrupt is a memory scrub interrupt, in which case control passes to step 404. Otherwise whatever other system management event occurred is serviced in step 403—a system power management event, for example.

Step 404 determines whether this is the first pass, or the first occurrence of a system management interrupt request 205 due to a particular correctable error event 204. If not control passes to step 412. If so, control passes to step 405, which reads, from section address register 130 within memory and ECC controller 101, the address of the section within RAM memory 102 that contains the word with a correctable error.

Next, step 406 reads or determines the size of this section. Typically, each section is the same size, but as more memory is added to the computer system each section contains more words. Step 408 tests if the size of this section is less than or equal to a predetermined limit, 8 megabytes (MB) in the particular case shown in FIG. 4. If so, then the entire section is scrubbed in step 407, and the system management service routine terminates in step 415.

If the size of the section to be scrubbed is greater than the limit, then, in step 409, the first subsection of the memory section containing the error is scrubbed. Next in step 410, another memory scrub interrupt is scheduled to occur after a predetermined delay, and the system management service routine terminates in step 415. Schedule system management interrupt signal 121 is used for this scheduling.

In step 412, the next memory subsection is scrubbed. Next, step 413 determines whether or not there is another memory subsection to be scrubbed. If not, then the system management service routine terminates in step 415. If so, then in step 414, another memory scrub interrupt is scheduled to occur after a predetermined delay, and the system management service routine terminates in step 415.

Independent System Management Firmware and Interrupt Requests

Figure 5:
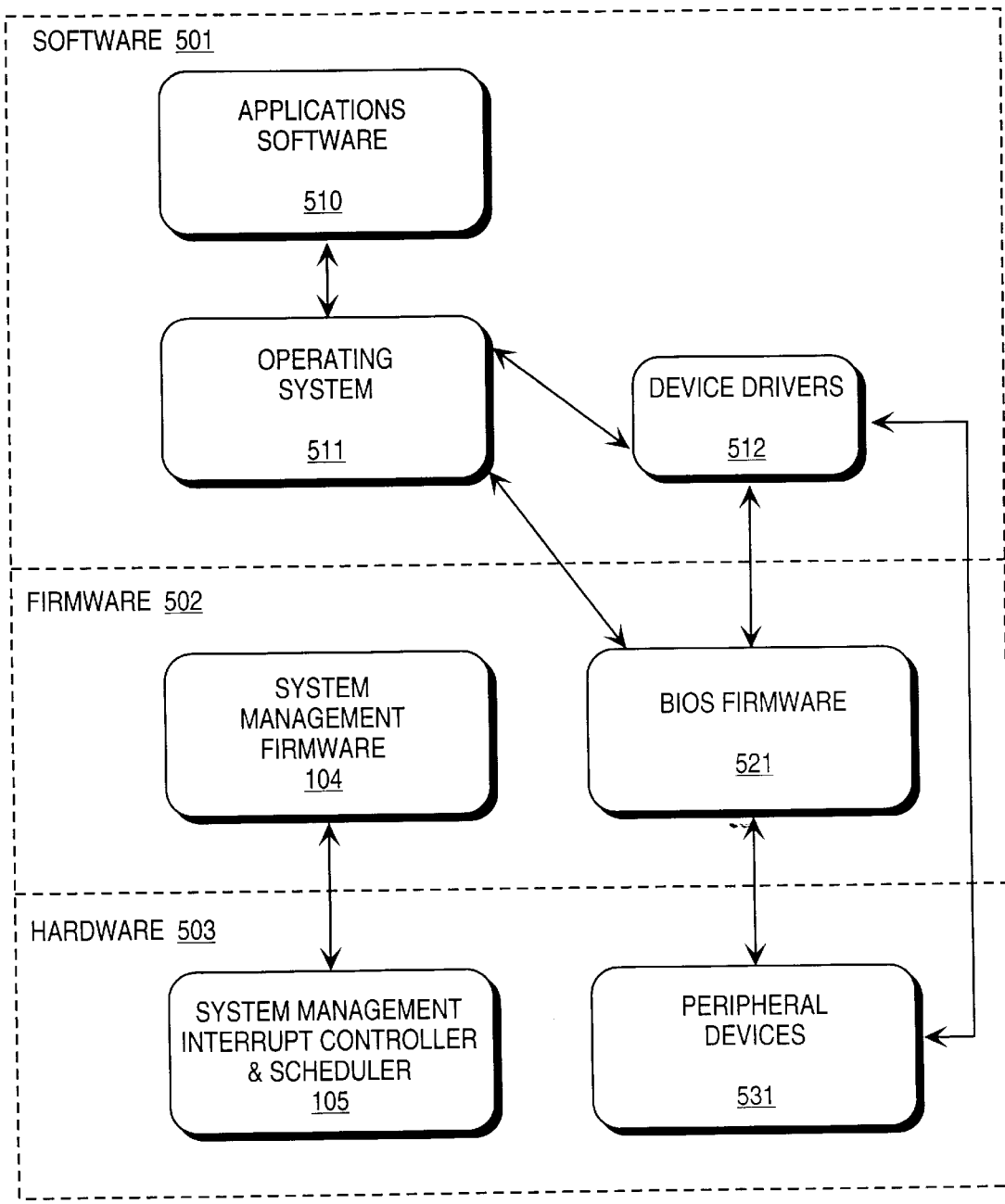
FIG. 5 shows the relationship, according to one embodiment of the present invention, among the system management firmware and the software, hardware and basic input/output system (BIOS) firmware of an example computer system.

FIG. 5 shows how system management firmware 104 fits in with the hardware, software and other firmware components of an example computer system in a way that is independent of, and transparent to, operating system 511.

System management interrupt controller and scheduler 105 schedules interrupts that activate system management firmware 104. It also receives requests from system management firmware 104 to schedule such interrupts to occur after a specified delay.

System management firmware 104 is independent of BIOS firmware 521, though both may reside in the same non-volatile memory device within the computer system. System management interrupt request signal 120 is independent of the interrupt request control signals that communicate between peripheral devices 531 and BIOS firmware 521 or software device drivers 512.

BIOS firmware 521 in a typical system supports basic input and output operations, such as display and keyboard control functions. Peripheral devices 531 and operating system 511 communicate by means of device interrupts handled by the BIOS and by means of the OS making calls to BIOS routines.

Other input and output operations are supported by device drivers 512. In these cases, applications software 510 and peripheral devices 531 communicate with each other by means of interrupts handed by the device drivers and device driver calls respectively. Software device drivers 512 are used instead of drivers within BIOS firmware 512 in the case of more complex peripheral devices such as network interface cards or of more advanced operating systems such as Windows NT™ or Windows 95™.

System management firmware 104 performs the memory scrub operation of the present invention without interfering in any way with peripheral devices 531, BIOS firmware 521, device drivers 512 (if used), operating system 511 or applications software 510.

An Example ECC Code and Algorithm

The present invention can be used with a variety of ECC codes, one of which is illustrated in FIG. 6. This particular ECC code started with Rao and Fujiwara's description[1] of a method for constructing a SEC-DED-S4ED rotational code that protects 64 data bits with 8 check bits. This code was augmented with the unused weight-3 column vectors to produce a code with length 72 that retains the SEC-DED-S4ED and rotational properties, and is symmetric.

[1] T. R. N. Rao and E. Fujiwara, *Error-Control Coding for Computer Systems*, Prentice Hall 1989, p. 287–293.

The first 64 columns of FIG. 6, i.e. those labeled data bits, show the G-matrix of the ECC code used in this embodiment. Each row of the G-matrix shows how to compute, on writing RAM memory 102, the corresponding check bit. The first 72 columns of FIG. 6, i.e. those labeled data bits and check bits, show the H-matrix of the ECC code used in this embodiment. Each row of the H-matrix shows how to compute, on reading RAM memory 102, the corresponding syndrome bit.

When writing a word into RAM memory 102, memory and ECC controller 101 computes the 8 check bits as follows:

For the check bit N, select the N'th row in the G-matrix, where the rows are numbered 0 to 7. The 64 columns of the G-matrix correspond to the 64 bits of the word specified by the device that is requesting the memory write operation.

Compute the 1-bit sum (i.e. the modulo-2 sum) of the data bits that are marked with a 1 in the selected row. That sum is the value of check bit N.

Write the 8 check bits computed above into the memory along with the 64 data bits of the word being written.

When reading a word from RAM memory 102, memory and ECC controller 101 computes the 8 syndrome bits as follows:

For the syndrome bit N, select the N'th row in the H-matrix, where the rows are numbered 0 to 7. The 72 columns of the H-matrix correspond to the 64 data bits and the 8 check bits of the word addressed by the device that is requesting the memory read operation.

Compute the 1-bit sum (i.e. the modulo-2 sum) of the data and check bits that are marked with a 1 in the selected row. That sum is the value of check bit N.

Then, memory and ECC controller 101 uses the syndrome to determine if an error has occurred, and if so what type of error, as follows:

If all syndrome bits are zero, then the memory word is correct as read.

Else, if either nibble of the syndrome (i.e. bits s0 to s3, or bits s4 to s7) is non-zero and the other nibble contains three one bits, then some nibble within the word read contains a three bit or a four bit error.

Else, if the syndrome contains an even number of one bits, then an un-correctable error has occurred (e.g. a double-bit error).

Else, if the syndrome contains an odd number of one bits, then a single-bit correctable error has occurred.

In the case of a single bit error, memory and ECC controller 101 uses the syndrome to invert exactly one bit within the word as read, as follows:

Compare the 8 syndrome bits to the 8 rows of the H-matrix of FIG. 6 column by column. The column that they match is the column corresponding to the bit position that was read erroneously. For example, if the syndrome bits are 0001 0101 (in s0 to s7 order), then the bit 7 of the word was read erroneously.

Invert whatever value was read for the bit position that corresponds with the matching column. In the same example, invert bit 7 of the word as read to generate the correct word.

In one embodiment, the data transferred over the system bus is protected from errors by using the same ECC code as is used for RAM memory 102. In this embodiment, memory and ECC controller 101 performs the above described syndrome generation and checking (and perhaps error correction) on data words received from the system bus before they are written into memory with the same error check bits (or perhaps with the corrected error check bits corrected, based on the above techniques).

CONCLUSION

As illustrated herein, the present invention provides a novel and advantageous method and apparatus for correcting errors in RAM memory. One skilled in the art will realize that alternative embodiments, design alternatives and various changes in form and detail may be employed while practicing the invention without departing from its principles, spirit or scope.

In particular the system architecture shown in FIG. 1, the control signals shown in FIG. 2, the memory map shown in FIG. 3, the steps in the memory scrub interrupt service routine shown in FIG. 4, the software/firmware/hardware relationships shown in FIG. 5 and the ECC code shown in FIG. 6 may be simplified, augmented or changed in various embodiments of the invention.

The following claims indicate the scope of the present invention. Any variation which comes within the meaning of, or range of equivalency of, any of these claims is within the scope of the present invention.

What is claimed is:

1. A computer system with memory error correction, comprising
 a memory to store data, the memory comprising a plurality of words, each word comprising data bits and error check bits, the memory being partitioned into a plurality of sections wherein each word belongs to one section and each section contains a plurality of words;
 a processor operable to read and rewrite each word within an indicated section, by reading and re-writing words within a first subsection of the indicated section, and then scheduling an interrupt to read and rewrite words within a second subsection of the indicated section; and
 a memory controller comprising circuitry to determine, in response to a word being read from the memory, if the word being read contains a correctable error, and if so to interrupt the processor, and to provide the processor with an indication of the section to which the word being read belongs, the interrupt occurring via an interrupt request signal distinct from that used for input/output interrupts.

2. The computer system according to claim 1, wherein said memory controller is further operable in response to a request to write into the memory to generate the error check bits based on the data bits being written.

3. The computer system according to claim 1, wherein said memory controller is further operable in response to a request to read from the memory to correct an error within any word based on the word's data bits and error check bits as read from the memory and to provide the corrected word in response to the request.

4. The computer system according to claim 1, wherein the indicated section is below a predetermined byte size and the reading an re-writing of words is performed in only the first section.

5. The computer system according to claim 1, wherein the processor services the interrupt using an address space, processor state and register set distinct from that used during normal processor operation and distinct from that used for input/output interrupts.

6. A method of memory error correction, comprising determining if a word read from a memory contains a correctable error, and if so:
 i) latching an indication of a section to which the erroneous word belongs, each word belonging to one of a plurality of sections and each section containing a plurality of words;
 ii) interrupting a processor via an interrupt request signal distinct from that used for input/output interrupts;
 iii) providing the processor with the section indication; and
 iv) reading and re-writing the words within a first subsection of the indicated section; scheduling an interrupt; and reading and re-writing the words within a second subsection of the indicated section in response to receiving the interrupt.

7. The method according to claim 6, further comprising:
 generating error check bits based on the data bits of a word being written into the memory; and
 storing both the error check bits and the data bits as the word being written.

8. The method according to claim 7, wherein the determining of a correctable error is based on the data bits and the error check bits read from said memory.

9. The method according to claim 6, wherein the indicated section is below a predetermined byte size and the reading an re-writing of words is performed in only the first section.

10. The method according to claim 6, wherein the processor services the interrupt using an address space, processor state and register set distinct from that used during normal processor operation and distinct from that used for input/output interrupts.

11. A computer system with memory error correction, comprising
 a) a memory means for storing data, the memory means comprising a plurality of words, each word comprising data bits and error check bits, the memory means being partitioned into a plurality of sections with each word belonging to one of the sections and each section containing a plurality of the words;
 a) a processor means for reading and writing words within the memory means and for re-writing each word within an indicated one of said memory sections, wherein the processor means reads and re-writes the words within a subsection of the indicated section by signaling the interrupt request means to re-interrupt the processor means, and by reading and re-writing, in response to the re-interrupt, the words within a second subsection of the indicated section;
 c) an interrupt request means for interrupting the processor, the interrupt request means being distinct from that used for input/output interrupts; and
 d) a memory controller means for generating the error check bits based on the data bits of any word being written into the memory, for determining based on the data bits and the error check bits if the word accessed by said read contains a correctable error in response to said processor means reading said memory means, and if so for latching an indication of the section to which said erroneous word belongs, for interrupting said processor means via said interrupt request means, and for providing said processor means with said section indication.

12. The method according to claim 10, wherein said processor means for reading and re-writing each word within the indicated section uses an address space, processor state and register set distinct from that used during normal processor operation and distinct from that used for input/output interrupts.

* * * * *